US010345841B1

(12) United States Patent
Jones, III et al.

(10) Patent No.: US 10,345,841 B1
(45) Date of Patent: Jul. 9, 2019

(54) CURRENT SOURCE WITH VARIABLE RESISTOR CIRCUIT

(71) Applicant: NXP USA, INC., Austin, TX (US)

(72) Inventors: Robert S. Jones, III, Austin, TX (US); Xiankun Jin, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/006,247

(22) Filed: Jun. 12, 2018

(51) Int. Cl.
G05F 1/63 (2006.01)
H03M 1/38 (2006.01)
G01R 31/28 (2006.01)

(52) U.S. Cl.
CPC ........... *G05F 1/63* (2013.01); *G01R 31/2884* (2013.01); *H03M 1/38* (2013.01)

(58) Field of Classification Search
CPC ......... G05F 1/63; G01R 31/2884; H03M 1/38
USPC .................................. 341/158, 155
See application file for complete search history.

(56) References Cited

U.S. PATENT DOCUMENTS

| 8,179,295 B2* | 5/2012 | Ho | H03M 1/1057 341/136 |
| 8,786,323 B2* | 7/2014 | Won | G05F 1/465 327/108 |
| 8,947,907 B1* | 2/2015 | Hollmer | G11C 7/04 365/148 |

(Continued)

OTHER PUBLICATIONS

Baker, R.J., "CMOS Circuit, Design; Layout, and Simulation"; IEEE Series on Microelectronic Systems, pp. 754-755, 2010.
(Continued)

*Primary Examiner* — Brian K Young
(74) *Attorney, Agent, or Firm* — David G. Dolezal

(57) ABSTRACT

A current source circuit includes a first variable resistor circuit. The first variable resistor circuit includes a resistive material and a first plurality of tap inputs configured to set a resistance of the first variable resistor circuit. The current source circuit includes an output configured to provide a current. The current is adjustable by varying the resistance of the first variable resistor circuit. The current source circuit includes a second variable resistor circuit. The second variable resistor circuit includes a resistive material of a same resistive material type as the resistive material of the first variable resistor circuit. The second variable resistor circuit includes a second plurality of tap inputs configured to set a resistance of the second variable resistor circuit. Each tap resistance of the second variable resistor circuit is proportional to a corresponding tap resistance of the first variable resistor circuit. A first terminal of the second variable resistor circuit is coupled to a first test port and a second terminal of the second variable resistor circuit is coupled to a second test port to allow for a resistance measurement of the second variable resistor circuit during a test mode. The current source circuit includes a non-volatile storage circuit configured to store a tap value generated during the test mode corresponding to a set of select signal values for the second plurality of tap inputs which provides a desired resistance of the second variable resistor circuit as determined during the test mode and to provide a set of select signal values for the first plurality of tap inputs based on the tap value stored in the non-volatile storage circuit.

19 Claims, 7 Drawing Sheets

(56) References Cited

U.S. PATENT DOCUMENTS 10,048,714 B2 * 8/2018 Zhu .......................... G05F 3/02
2009/0251227 A1 10/2009 Jasa

OTHER PUBLICATIONS

Osipov, D., "Temperature-Compensated B-Multiplier Current Reference Circuit", IEEE Transactions on Circuits and Systems—II: Express Briefs, vol. 64, No. 10, Oct. 2017.
Razavi, B., "Design of Analog CMOS Integrated Circuits", McGraw-Hill Series in Electrical and Computer Engineering, pp. 377-379 and 393, International Edition 2001.
Talebbeydokhti, N., "Constant Transconductance Bias Circuit with an On-Chip Resistor", IEEE 2006.

* cited by examiner

US 10,345,841 B1

CURRENT SOURCE WITH VARIABLE RESISTOR CIRCUIT

BACKGROUND OF THE INVENTION

Field of the Invention

This invention relates in general to current sources for providing a current.

Description of the Related Art

Current sources can be used to provide currents for circuitry of an integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments described herein, a current source circuit includes an output for providing a current and includes a first variable resistor circuit. An amount of current provided by the output is adjustable by varying the resistance of the first variable resistor circuit. The first variable resistor circuit receives tap select signals for setting the resistance of the first variable resistor circuit. The current source circuit includes a second variable resistor circuit. The second variable resistor circuit including resistive material of a same resistive material type as resistive material of the first variable resistor circuit. The second variable resistor circuit including a first end coupled to a first test port and a second end coupled to a second test port to allow for a measurement of the resistance of the second variable resistor circuit during a test mode. The second variable resistor circuit including select inputs to receive tap select signals for setting a resistance of the second variable resistor during a test mode. The current source circuit includes a non-volatile storage circuit to store a tap value generated during the test mode. The tap select signals provided to the first variable resistor circuit are based on the tap value stored in the non-volatile storage circuit.

Figure 1:
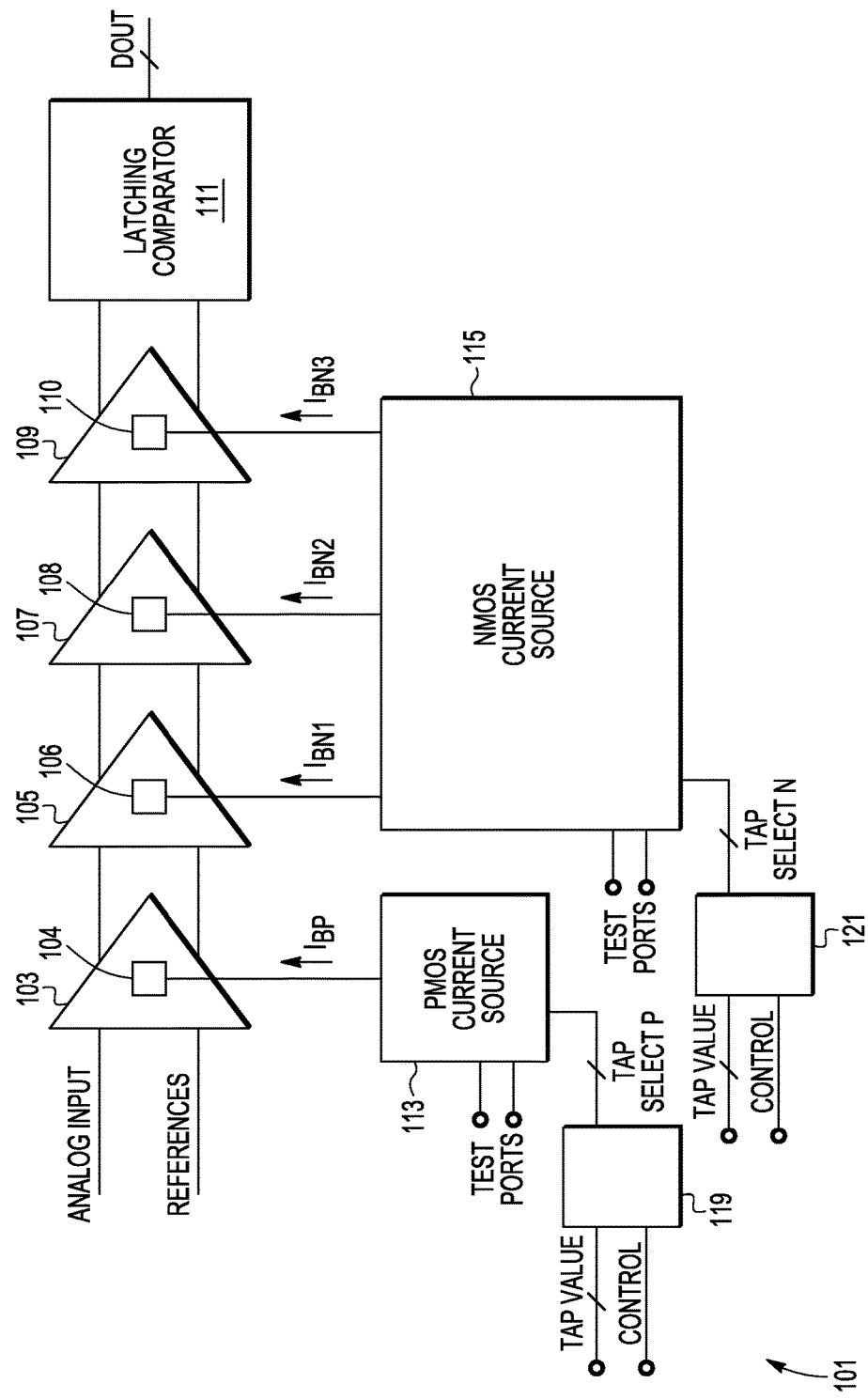
FIG. 1 is a block diagram of an analog to digital converter circuit according to one embodiment of the present invention.

FIG. 1 is a block diagram of an analog to digital converter (ADC) circuit 101 according to one embodiment of the presentation invention. In one embodiment, ADC circuit 101 is a successive approximation register (SAR) analog to digital converter. ADC circuit 101 includes comparison stages 103, 105, 107, and 109 for comparing an analog input signal (ANALOG INPUT) to different reference voltages levels. Latched output 111 provides a digital representation (DOUT) of the analog input signal.

In one embodiment, stages 103, 105, 107, and 109 each include a current mirror/reference 104, 106, 108, and 110, respectively. Each current mirror/reference 104, 106, 108, and 110 receives a bias current for use in its operations. In one embodiment, current mirror/reference 104 receives bias current $I_{BP}$ from PMOS current source 113 and current mirror/references 106, 108, and 110 receive bias currents $I_{BN1}$, $I_{BN2}$, and $I_{BN3}$, respectively, from NMOS current source 115. In one embodiment, current sources 113 and 115 are sized to achieve a constant transconductance gm bias so as to improve accuracy of the stages (103, 105, 107, and 109) with respect to process and temperature variations.

The bias currents ($I_{BP}$, $I_{BN}$) are trimmable by setting the resistance of a variable resistor circuit (217 in FIGS. 2 and 311 in FIG. 3) of the current source providing the bias current. As will be described later, the resistances of the variable resistor circuits are set during a test mode in which the resistances of replica variable resistor circuits of each current source are measured by an external tester. Circuit 101 includes controllers 119 and 121 for providing tap select signals (TAP SELECT P, TAP SELECT N) to current sources 113 and 115, respectively, for setting the resistive values of the variable resistor circuits of the current sources.

Figure 2:
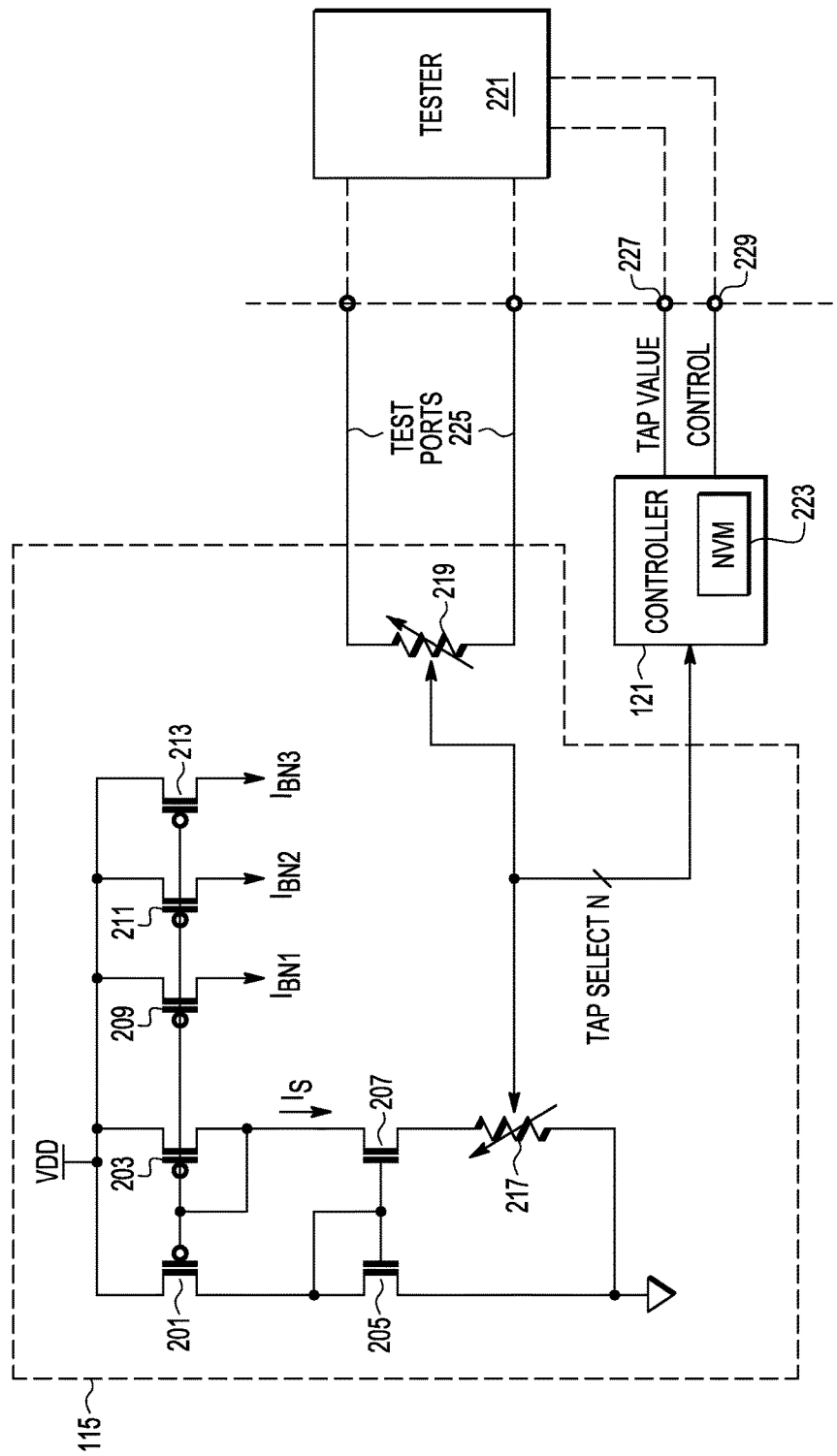
FIG. 2 is circuit diagram showing a current source and tester according to one embodiment of the present invention.

FIG. 2 is a circuit diagram of NMOS current source 115 and controller 121 according to one embodiment of the present invention. FIG. 2 also shows how current source 115 and controller 121 are coupled to an external tester 221 during a test mode for measuring the resistance of replica variable resistor circuit 219 and for providing signals to controller 121 to set the resistance of variable resistor circuit 219 during a test mode.

Current source 115 includes transistors 201, 203, 205, 207, 209, 211, and 213 and includes a variable resistor circuit 217 whose resistance is adjustable to adjust the bias currents $I_{BN1}$, $I_{BN2}$, and $I_{BN3}$ provided to NMOS transistors (not shown) of current mirror/references 106, 108, and 110 of comparison stages 105, 107, and 109, respectively. In the embodiment shown, current source 115 is a constant transconductance (gm) current source where the transconductance (gm) is the inverse of the resistance of variable resistor circuit 217 and is generally invariant of voltage, temperature, and process. The constant conductance property is obtained by the current mirror of PMOS transistors 201 and 203 and the positive feedback of the current mirror of NMOS transistors 205 and 207. In one embodiment, current sources 113 and 115 are characterized as beta multiplier current sources. Current source 115 produces a current $I_S$ through the current mirror leg of transistors 203 and 207 and variable resistor circuit 217. Current $I_S$ is mirrored as currents $I_{BN1}$, $I_{BN2}$) and $I_{BN3}$ in the current mirror paths of transistors 209, 211, and 213, respectively. In one embodiment, currents $I_{BN1}$, $I_{BN2}$, and $I_{BN3}$ are equal to current $I_S$, however, in other embodiments, currents $I_{BN1}$, $I_{BN2}$, and $I_{BN3}$ are multiples of current $I_S$. In some embodiments, current source 115 may include a fixed resistor (not shown) in series with variable resistor circuit 217. Utilizing a constant gm current source, may allow in some embodiments for the generation of a bias current that can be trimmed at a single temperature while insuring that the comparator (103, 105, 107, 109) gain and bandwidth remain relatively constant over wide ranging process, voltage and temperature conditions. In other embodiments, transistors 201, 203, 205, 207, 209, 211, 213 may be implemented in a cascaded configuration.

Current source 115 includes a replica variable resistor circuit 219. In one embodiment, replica variable resistor circuit 219 includes the same type of resistive material as variable resistor circuit 217. In another embodiment, variable resistor circuit 217 and replica resistor circuit 219 each have corresponding tap resistance values that are proportional to each other. A tap resistance value is the resistance value provided by a variable resistor circuit that corresponds to a specific tap setting. In one embodiment, the proportional corresponding tap resistances are the same. In another embodiment, the proportional corresponding tap resistances are a constant multiple (e.g. 0.5, 2.0, 3.0) across all of the corresponding tap resistances. In one embodiment, each resistor circuit 217 and 219 has 10 taps. Tap 6 represents the target resistance, Tap 10 represents the maximum resistance target to compensate for the lowest resistance deviation within the process. Tap 1 represents the lowest resistance target to compensate for maximum resistance deviation of the process. Taps 2-5 evenly compensate for higher than target resistance and taps 7-9 compensate for lower than target resistance from the process. The value of tap resistance is determined by evenly spacing the tap resistances across taps 2-9 and thus eliminating resistance impact on beta multiplier current. In one embodiment, all the tap resistances are evenly spaced from each other. In other embodiments, the spacings are not even.

Controller 121 includes a set of tap select signal lines (TAP SELECT N) for setting the resistances of both variable resistor circuit 217 and replica variable resistor circuit 219. In one embodiment, the assertion of a specific tap select line selects a specific tap of variable resistor circuit 217 and the corresponding tap of variable resistor circuit 219 to provide the desired resistance. In other embodiments, controller 121 would include two sets of tap select signal line outputs, one for each variable resistor circuit.

Controller 121 includes a non-volatile storage circuit (NVM) 223 for storing a tap value indicative of the desired tap to be used by variable resistor circuit 217 during a normal operating mode. In one embodiment, NVM 223 is a one-time programmable nonvolatile memory device such as a set of fuses. However, in other embodiments, NVM 223 can be other types of nonvolatile memory devices such as a flash memory, an EEPROM, an MRAM, or a ReRAM device.

In some embodiments, NVM 223 stores a binary number that indicates the specific tap number of the variable resistor circuit to be used in providing the desired resistance. In one embodiment, Controller 121 includes a decoder (not shown) for decoding the value stored in NVM 223 to assert the appropriate select line of TAP SELECT N lines. In other embodiments, the tap value is the actual value provided by the tap select signals. In one such embodiment, NVM 223 would include a fuse for each tap select line where one fuse would be blown to select a specific tap resistance.

FIG. 2 shows how an external tester 221 is connected to the current source 115 and controller 121 for determining the desired tap setting of variable resistor circuit 217 during a test mode. During a test mode, tester 221 is connected to test ports 225, tap value port 227, and control port 229 of the integrated circuit of ADC converter circuit 101 to measure the resistance of replica variable resistor circuit 219 (through test ports 225) and adjust the resistance of resistor circuit 219 until it reaches desired resistance. Specifically, tester 221 measures the resistance of variable resistor circuit 219 from test ports 225 which are connected to the ends of resistor circuit 219. In the embodiment shown, tester 221 adjusts the resistance of circuit 219 by changing the tap value via tap port 227. Controller 121 is placed in a test mode by the line connected to port 229. In the embodiment shown, tap value port 227 and control port 229 are each single line ports where the tap value is communicated serially via the tap port 229. However, tester 221 may be connected to an integrated circuit as per other configurations in other embodiments. For example, in some embodiments, the control information and tap values may be provided to controller 121 by a parallel bus (not shown). In some embodiments, one of test ports 225 is a supply voltage (VDD, Ground) test port. In one embodiment, tester is an ULTRAFLEX TEST SYSTEM by TERADYNE.

Figure 3:
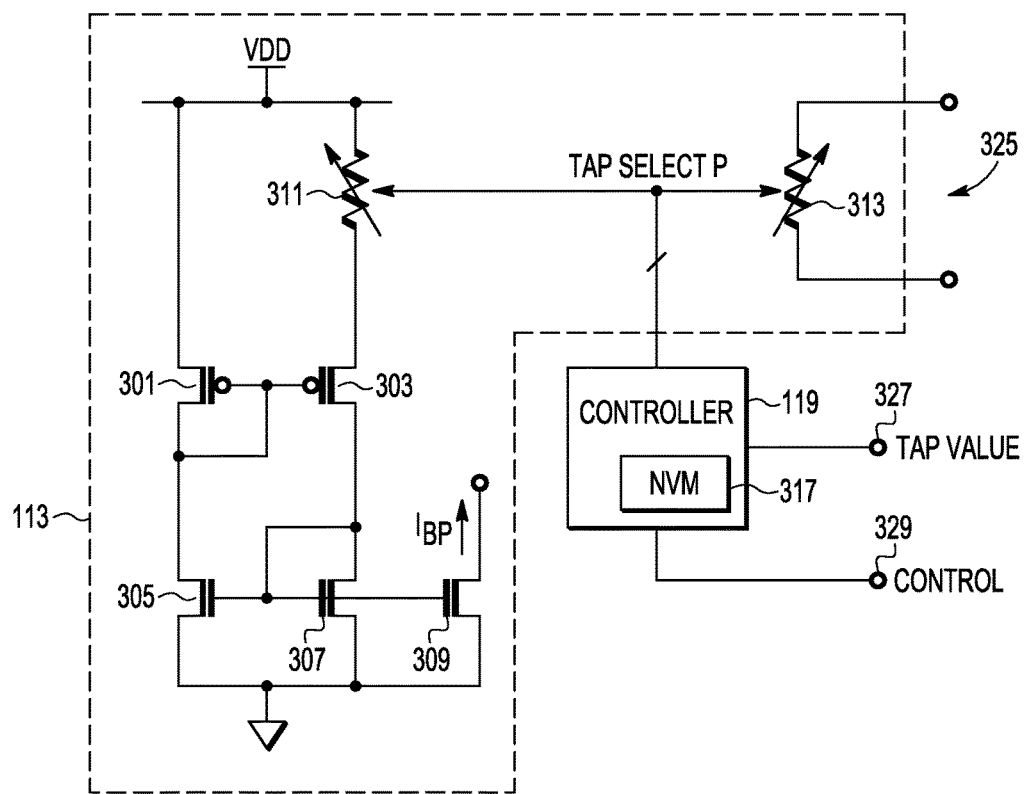
FIG. 3 is a circuit diagram of a current source according to one embodiment of the present invention.

FIG. 3 is a circuit diagram of PMOS current source 113 and controller 119. Current source 113 includes transistors 301, 303, 305, 307, and 309 and includes variable resistor circuit 311 and replica resistor circuit 313. Current source 113 provides a bias current $I_{BP}$ to a PMOS transistor (not shown) of current mirror/reference 104 of comparator stage 103. Tap select signals lines (TAP SELECT P) from controller 119 determine which tap of circuit 311 will be used to provide the desired resistance. Controller 121 includes a non-volatile storage circuit (NVM) 317 for storing a value indicative of the desired tap to be used by variable resistor circuit 311 during a normal operating mode. Ports 325 are for connecting to an external tester (not shown in FIG. 3) to measure the resistance of resistor circuit 313. Ports 327 and 329 are for receiving tap values and control signals from an external tester. The desired resistance of variable resistor circuit 311 is set in a similar manner as with variable resistor circuit 217. In some embodiments, ADC circuit 101 would include a single controller to set the desired resistances of both variable resistive circuit 217 and variable resistive circuit 311.

Figure 4:
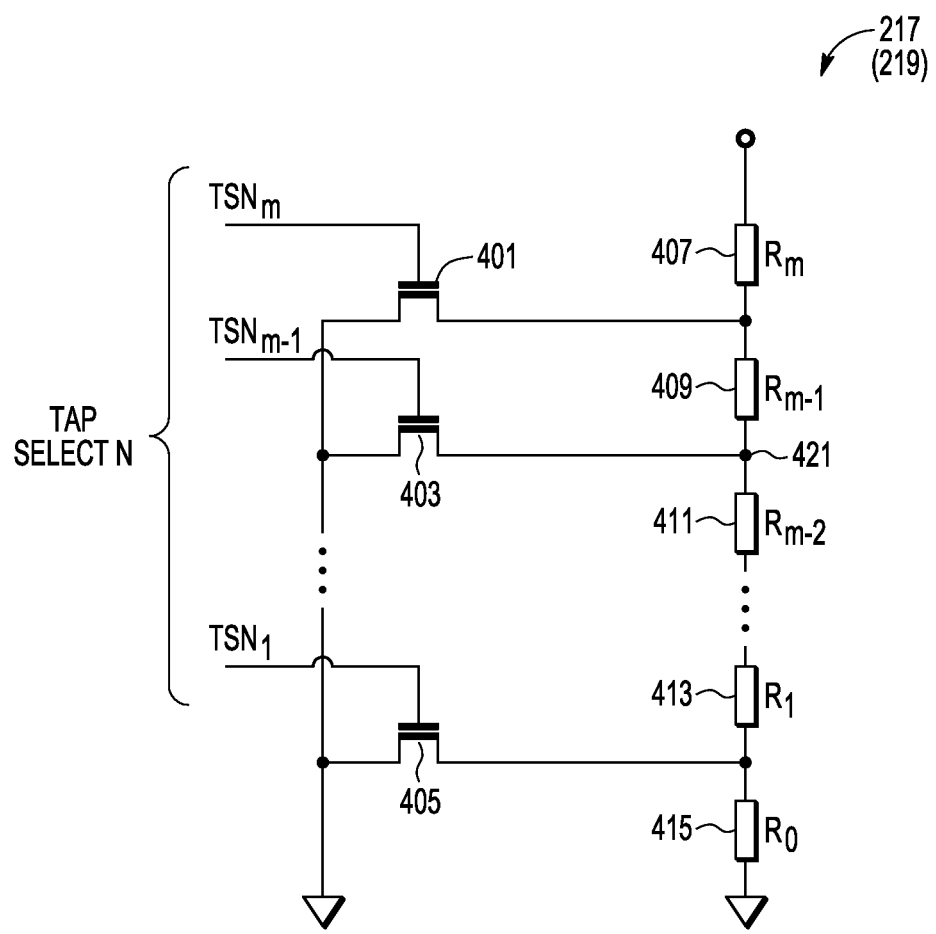
FIG. 4 is a circuit diagram of a variable resistor circuit according to one embodiment of the present invention.

FIG. 4 shows a circuit diagram of variable resistor circuit 217 of FIG. 2 according to one embodiment. In the embodiment shown, circuit 217 includes a stack of resistive material elements 407, 409, 411, 413, and 415 with each element for providing a resistance between the taps. Each tap is connected to a tap node (421) and includes a select transistor (401, 403, 405) whose input is controlled by a tap select signal line ($TSN_{1-M}$) from controller 121. Resistive element 407 is connected to transistor 207.

The resistance provided by circuit 217 is adjusted by selecting the appropriate tap with the asserted tap select line to make one of the select transistors (401, 403, 405) conductive to short the tap node to ground. For example, if transistor 403 is made conductive by asserting select signal line $TSN_{M-1}$, then the tap node 421 is shorted to ground. Thus, the tap resistance provided by circuit 217 includes resistive material elements 407, 409, and 411 but not resistive elements 413 and 415. The largest possible resistance is where no selective tap signal lines are asserted such that the tap resistance includes the values of resistive material elements 407, 409, 411, 413, and 415. The smallest resistance is where tap signal line $TSN_M$ is asserted such that the tap resistive value includes only resistive material element 407.

Replica variable resistor circuit 219 is configured similar to circuit 217 except that the system ground shown in FIG. 4 is connected to one of test ports 225 and element 407 is connected to the other test port 225.

Figure 5:
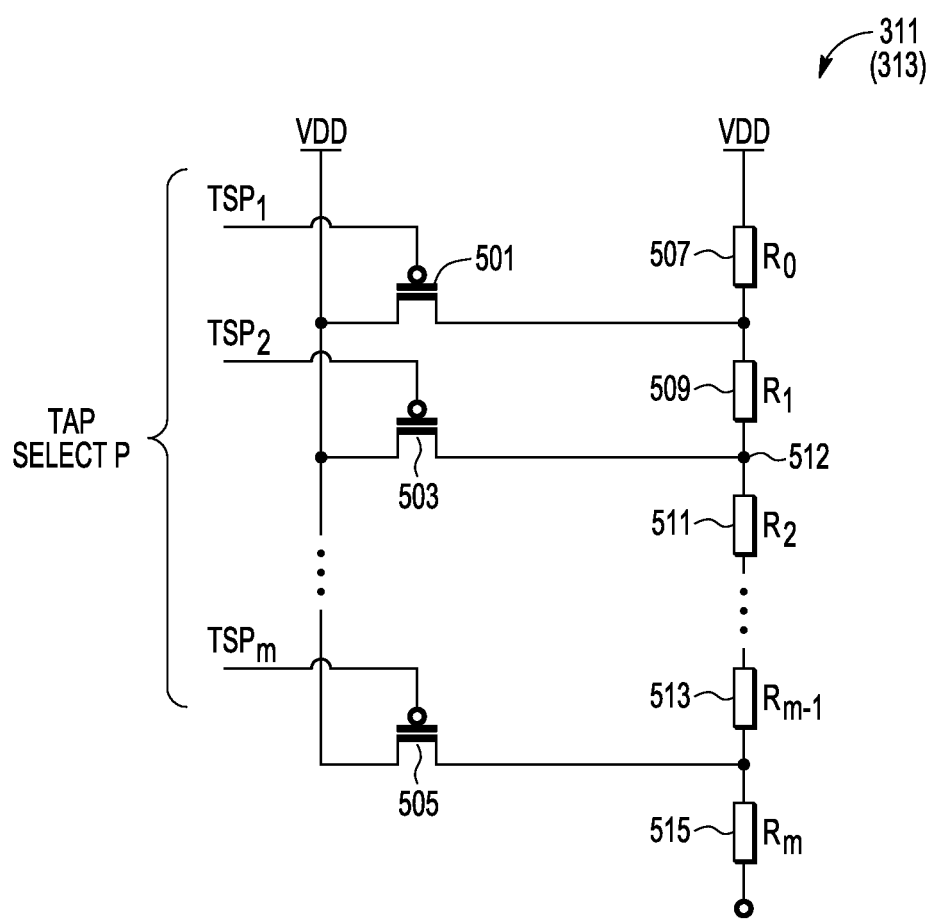
FIG. 5 is a circuit diagram of a variable resistor circuit according to one embodiment of the present invention.

FIG. 5 shows a circuit diagram of variable resistor circuit 311 of FIG. 3 according to one embodiment. In the embodiment shown, circuit 311 includes a resistor stack of resistive material elements 507, 509, 511, 513, and 515, each for providing a resistance between the taps. Each tap includes a tap node (512) and a select transistor (501, 503, 505) whose input is controlled by a select signal line ($TSP_{1-M}$) from controller 119. Resistive element 515 is connected to transistor 303.

As with the circuit of FIG. 4, the values of the tap select lines $TSP_1$-$TSP_M$ determine the amount of resistance provided by circuit 311. When tap select signal line $TSP_1$ is asserted, the circuit 311 has a resistance of $R1+R2+R_{M-1}+R_M$. When tap select line $TS_{PM}$ is asserted, circuit 313 has a resistance of $R_M$.

Variable resistor circuit 313 is similar to circuit 311 except that the VDD terminal in FIG. 3 is connected to one of test ports 325 and element 515 is connected to the other of test ports 325.

Figure 6:
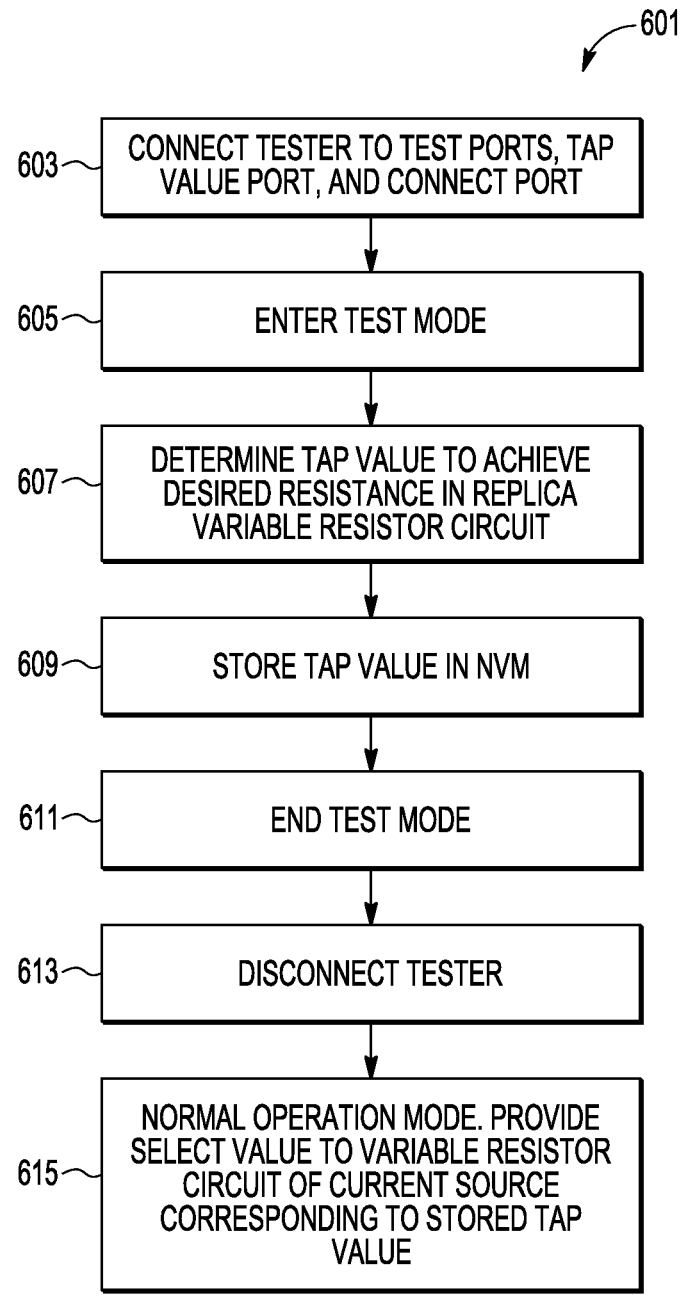
FIG. 6 is a flow diagram of a test mode of operation for setting a resistance of a replica variable resistor circuit according to one embodiment of the present invention.

FIG. 6 sets forth a flow diagram of a test mode for setting the resistive value of variable resistor circuit 217 of current source 115 according to one embodiment of the present invention. In one embodiment, the test method of FIG. 6 is performed as part of the manufacture of an integrated circuit or during the manufacture of a system that utilizes the integrated circuit.

In operation 603, a tester 221 is connected to test ports 225, tap value port 227, and control port 229. In operation 605, controller 121 enters a test mode. In one embodiment, the test mode is entered in response to an assertion of a control signal by tester 221 via control port 229.

In operation 607, a tap value is determined that will achieve a desired measured resistance in the replica variable resistor circuit 219. In one embodiment, this operation is performed by tester 221 providing various tap values to controller 121 via port 227 where controller 121 provides the tap select signal values corresponding to the tap values to resistor circuit 219. For each tap value provided, tester 221 measures the resistance of replica variable resistor circuit 219 and compares it against a desired resistance value to determine which tap value provides the desired resistance. In other embodiments, upon the assertion of the control signal from control port 229, controller 121 cycles through all of the select signal settings and stops when tester 221 indicates (ether through the tap value port 327 or control port 329) the select setting that provides the desired resistance. In some embodiments, the different tap values may be tested in a consecutive numerical order or testing may be done as part of a binary search pattern (e.g. starting with the mid-tap value and going up or down based on whether the measured resistance is higher or lower than the desired resistance). In one embodiment, operation 607 is performed at a controlled temperature (e.g. 20 C)

When tester 221 determines the tap value that provides the desired measured resistance in operation 607, the tap value providing the desired resistance is stored in NVM 223 in operation 609. In one embodiment, controller 121 writes the tap value to NVM 223. In other embodiments, an external programmer may be used to write the tap value to NVM 223.

In operation 611, the test mode is ended, and in operation 613, the integrated circuit is removed from tester 221. Afterwards, in a normal operational mode 615, the select signals provided by select lines N correspond to the stored tap value in NVM 223 to set the bias currents $I_{BN1-3}$ to their appropriate values. Variable resistor circuit 311 of current source 113 can be programmed in a similar manner as well.

Figure 7:
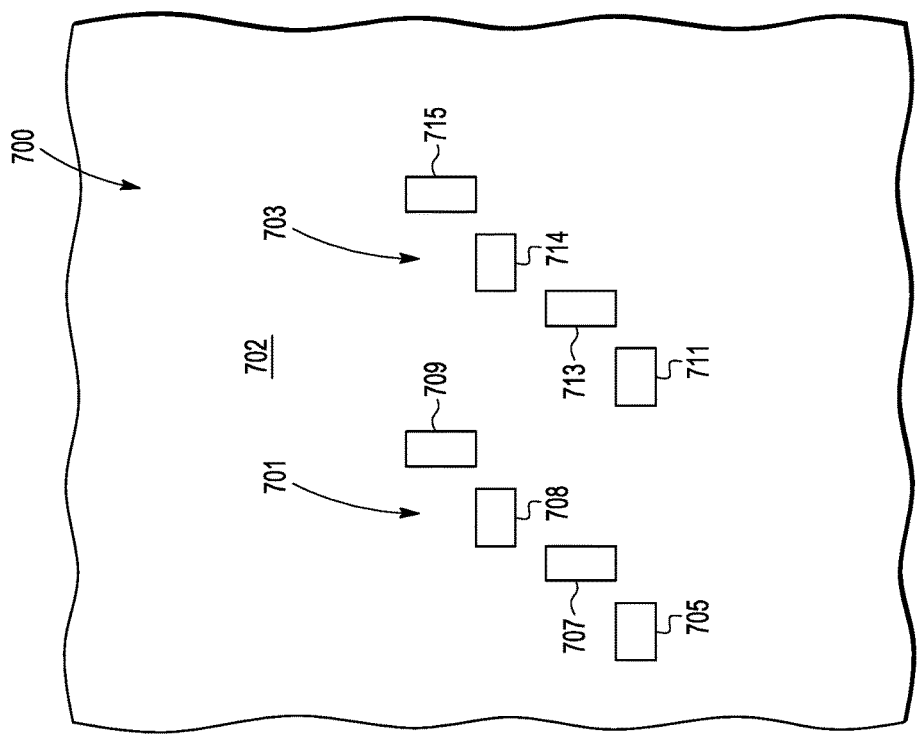
FIG. 7 is a partial cutaway top view of an integrated circuit according to one embodiment of the present invention.

FIG. 7 shows a partial top cutaway view of an integrated circuit 700. Integrated circuit 700 includes a variable resistor circuit 701 (similar to resistor circuit 217) that is part of a current source (not shown) of the integrated circuit and a replica variable resistor circuit 703 (similar to resistor circuit 219).

FIG. 7 shows the resistive material for resistor circuits 701 and 703. In the embodiment shown, the resistive material for resistor circuits 701 and 703 are polysilicon segments located on a substrate 702 of integrated circuit 700. Circuit 701 includes polysilicon segments 705, 707, 708, and 709 arranged in a resistor stack. Circuit 703 includes polysilicon segments 711, 713, 714, and 715 arranged in a resistor stack. The polysilicon segments are connected together and connected to tap lines and select transistors (not shown) by interconnect structures (not shown) located in interconnect layers above the polysilicon elements. In one embodiment, the polysilicon elements are located in the gate polysilicon layer of integrated circuit 700. However, they may be located in other layers in other embodiments.

Each polysilicon segment shown in FIG. 7 is located between a tap node (e.g. 421 of FIG. 4) such that resistive element may be included or excluded from the resistance provided by the variable resistor circuit depending upon the tap select signal values. In one embodiment, each polysilicon segment (705) is sized and doped with conductivity dopants to provide a desired resistance.

In the embodiment shown, each resistive material segment of replica circuit 703 corresponds to a resistive material segment of circuit 701. For example, segment 715 corresponds to segment 709. In the embodiment shown, the structural layout of the resistive material of circuit 701 matches the structural layout of the resistive material of circuit 703 in that each element is of the same length, width, thickness, doping concentration, and orientation as its corresponding element. With such a layout configuration and with having the same resistive material, the resistance values of the elements will match their corresponding resistance values regardless of process variations (e.g. variations in doping, thickness etc.). In some embodiments, the corresponding interconnects (not shown) are of the same size and orientation as well between the two variable resistor circuits. In some embodiments, the resistive elements of circuit 701 may be interspersed with the resistive elements of circuit 703.

Figure 8:
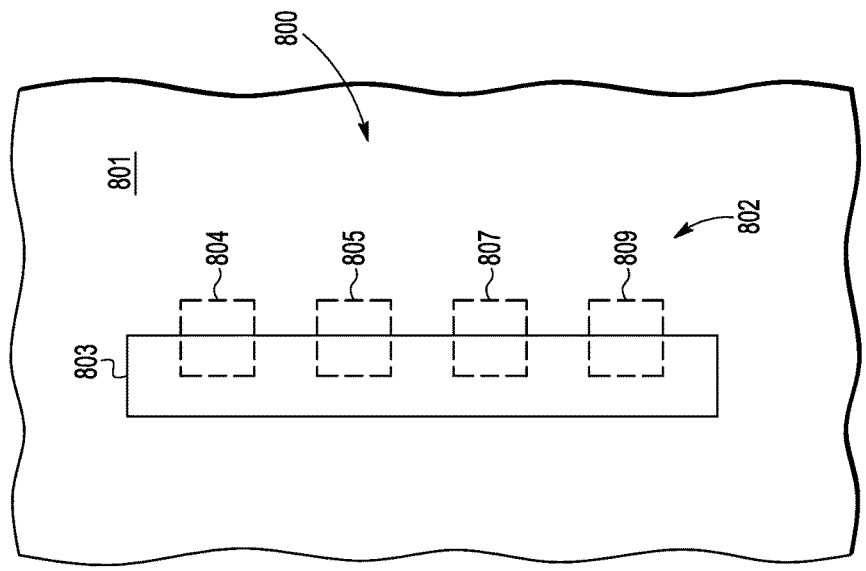
FIG. 8 is a partial cutaway top view of an integrated circuit according to another embodiment of the present invention.

FIG. 8 shows a partial cutaway top view of an integrated circuit 800 that includes a variable resistor circuit 802 according to another embodiment of the present invention. Variable resistor circuit 802 includes a polysilicon strip 803 that is doped to provide a desired amount of resistance per length. In the embodiment shown, strip 803 is characterized as a resistor stack. Spaced apart at various locations underneath strip 803 are doped wells 804, 805, 807, and 809 in electrical contact with strip 803. These wells serve as the source regions for tap select transistors (e.g. 401, 403, and 405) that are used to select the amount of resistance that circuit 802 will provide. Not shown are the drain regions of the select transistors (that are coupled to VDD or ground) nor the gates of the select transistor that are coupled to the tap select signal lines. The replica variable resistor circuit (not shown) would have a similar shape and form to circuit 802.

In other embodiments, other types of variable resistive circuits may be utilized. For example, a variable resistive circuit may include other types of resistive material e.g. doped monocrystalline material in the substrate or a resistive material in the interconnect layers.

In one embodiment, providing a replica variable resistor for measuring a resistance during a test mode to generate a tap value and then using the tap value to set a resistive value of a variable resistor circuit of a current source may allow for in some embodiments, the ability to trim a current of a current source by adjusting a variable resistor without an external tester having to measure the resistance of the variable resistor circuit of the current source. With such a configuration, the current source does not have to include devices for coupling and decoupling the variable resistor circuit to an external tester. Accordingly, the resistance of a variable resistor circuit can be adjusted to trim a current produced by the current source without having the variable resistor circuit include coupling devices.

With some examples, coupling devices such as transistors, interconnects, or other types of switches can add resistance to the mirror leg of a variable resistor circuit which can alter the desired constant transconductance of the bias current produced by the current source. Such an alteration could affect the operation of circuitry utilizing the bias current, e.g. such as current mirror/reference (104) of a comparison stage of an ADC converter. Furthermore, such coupling circuitry may produce leakage currents or add parasitic capacitances. Utilizing the replica variable resistor circuit may provide for a transconductance current source to be trimmed without affecting the desired transconductance of the current source.

Features shown or described herein with respect to one embodiment may be implemented with other embodiments shown or described herein.

In one embodiment, a current source circuit includes a first variable resistor circuit. The first variable resistor circuit includes a resistive material and a first plurality of tap inputs configured to set a resistance of the first variable resistor circuit. The current source circuit includes an output configured to provide a current. The current is adjustable by varying the resistance of the first variable resistor circuit. The current source circuit includes a second variable resistor circuit. The second variable resistor circuit includes a resistive material of a same resistive material type as the resistive material of the first variable resistor circuit. The second variable resistor circuit includes a second plurality of tap inputs configured to set a resistance of the second variable resistor circuit. Each tap resistance of the second variable resistor circuit is proportional to a corresponding tap resistance of the first variable resistor circuit. A first terminal of the second variable resistor circuit is coupled to a first test port and a second terminal of the second variable resistor circuit is coupled to a second test port to allow for a resistance measurement of the second variable resistor circuit during a test mode. The current source circuit includes a non-volatile storage circuit configured to store a tap value generated during the test mode corresponding to a set of select signal values for the second plurality of tap inputs which provides a desired resistance of the second variable resistor circuit as determined during the test mode and to provide a set of select signal values for the first plurality of tap inputs based on the tap value stored in the non-volatile storage circuit.

Another embodiment includes a method of operating a current source circuit. The current source circuit includes a first variable resistor circuit and an output configured to provide a current which is adjustable by varying a resistance of the first variable resistor circuit. The method includes during a test mode, adjusting tap inputs of a second variable resistor circuit to vary a resistance of the second variable resistor circuit until a desired resistance of the second variable resistor circuit is achieved and storing a resulting tap value corresponding to the tap inputs which resulted in the desired resistance of the second variable resistor circuit. The method includes during normal operation, setting tap inputs of the first variable resistor circuit based on the stored resulting tap value, wherein the current source circuit provides current through the first variable resistor circuit to an output. The second variable resistor circuit includes a resistive material of a same resistive material type as a resistive material of the first variable resistor circuit.

In another embodiment, a current source circuit includes a variable resistor circuit. The variable resistor circuit includes a resistive material and a first plurality of tap inputs configured to set a resistance of the variable resistor circuit. The current source circuit includes an output configured to provide a current. The current is adjustable by varying the resistance of the variable resistor circuit. The current source circuit includes a replica variable resistor circuit. The replica variable resistor circuit includes a resistive material of a same resistive material type as the resistive material of the variable resistor circuit. The replica variable resistor circuit includes a second plurality of tap inputs configured to set a resistance of the replica variable resistor circuit. Each tap resistance of the replica variable resistor circuit is a same tap resistance as a corresponding tap resistance of the variable resistor circuit. The replica variable resistor circuit is coupled to a test port such that, during a test mode, a tester is capable of determining a desired resistance of the replica variable resistor circuit. A set of select signal values for the second plurality of tap inputs corresponds to the desired resistance. The current source circuit includes a non-volatile storage circuit configured to store a tap value generated during the test mode corresponding to the set of select signal values for the second plurality of tap inputs. During a normal operational mode, the first plurality of tap inputs receives a set of select signal values that are based on the tap value stored in the non-volatile storage circuit in order to set the resistance of the variable resistor circuit to a same resistance as the desired resistance.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. A current source circuit comprising:
    a first variable resistor circuit, wherein the first variable resistor circuit includes a resistive material and a first plurality of tap inputs configured to set a resistance of the first variable resistor circuit;
    an output configured to provide a current, wherein the current is adjustable by varying the resistance of the first variable resistor circuit;
    a second variable resistor circuit, wherein:

the second variable resistor circuit includes a resistive material of a same resistive material type as the resistive material of the first variable resistor circuit,
the second variable resistor circuit includes a second plurality of tap inputs configured to set a resistance of the second variable resistor circuit, wherein each tap resistance of the second variable resistor circuit is proportional to a corresponding tap resistance of the first variable resistor circuit, and
a first terminal of the second variable resistor circuit is coupled to a first test port and a second terminal of the second variable resistor circuit is coupled to a second test port to allow for a resistance measurement of the second variable resistor circuit during a test mode; and
a non-volatile storage circuit configured to store a tap value generated during the test mode corresponding to a set of select signal values for the second plurality of tap inputs which provides a desired resistance of the second variable resistor circuit as determined during the test mode and to provide a set of select signal values for the first plurality of tap inputs based on the tap value stored in the non-volatile storage circuit.

2. The current source circuit of claim 1, wherein each tap resistance of the second variable resistor circuit has a same tap resistance as each corresponding tap resistance of the first variable resistor circuit.

3. The current source circuit of claim 1, further comprising:
a current mirror, wherein a leg of the current mirror comprises the first variable resistor circuit.

4. The current source circuit of claim 1, wherein the set of select signal values for the first plurality of tap inputs based on the tap value stored in the non-volatile storage circuit is provided to the first variable resistor circuit during normal operation.

5. The current source circuit of claim 4, wherein, during normal operation, the current source circuit provides current though the first variable resistor circuit and does not provide current through the second variable resistor circuit.

6. The current source circuit of claim 1, wherein the current source circuit is characterized as a transconductance current source.

7. The current source circuit of claim 1, wherein each tap input of the first plurality of tap inputs enables a corresponding tap node along a resistor stack of the first variable resistor circuit to be shorted to a supply voltage terminal.

8. The current source circuit of claim 7, and each tap input of the second plurality of tap inputs enables a corresponding tap node along a resistor stack of the second variable resistor circuit to be shorted to a test port.

9. The current source circuit of claim 1, wherein the resistive material each of the first variable resistor circuit and second variable resistor circuit has a same layout structure.

10. The current source circuit of claim 1, wherein the current source circuit is formed in an integrated circuit and wherein the resistive material of the first variable resistor circuit and the second variable resistor circuit are formed in a same layer of the integrated circuit.

11. The current source circuit of claim 1, wherein the resistive material type of each of the first and second variable resistor circuits is characterized as polysilicon.

12. A successive approximation register analog to digital converter circuit comprising:
a latching comparator;
a comparator stage having an output coupled to the latching comparator; and
the current source circuit of claim 1 coupled to provide the current to the comparator stage.

13. A method of operating a current source circuit, the current source circuit includes a first variable resistor circuit and an output configured to provide a current which is adjustable by varying a resistance of the first variable resistor circuit, the method comprising:
during a test mode, adjusting tap inputs of a second variable resistor circuit to vary a resistance of the second variable resistor circuit until a desired resistance of the second variable resistor circuit is achieved and storing a resulting tap value corresponding to the tap inputs which resulted in the desired resistance of the second variable resistor circuit; and
during normal operation, setting tap inputs of the first variable resistor circuit based on the stored resulting tap value, wherein the current source circuit provides current through the first variable resistor circuit to an output, wherein the second variable resistor circuit includes a resistive material of a same resistive material type as a resistive material of the first variable resistor circuit;
wherein during normal operation, current is not provided through the second variable resistor circuit.

14. The method of claim 13, wherein each tap resistance of the second variable resistor circuit is proportional to a corresponding tap resistance of the first variable resistor circuit.

15. The method of claim 13, wherein each tap resistance of the second variable resistor circuit is equal to as a corresponding tap resistance of the first variable resistor circuit.

16. The method of claim 13, further comprising:
during the test mode, coupling a tester to each end of the second variable resistor circuit, wherein the adjusting is performed by the tester.

17. The method of claim 13, wherein the resulting tap value is stored in a non-volatile storage circuit.

18. A current source circuit comprising:
a variable resistor circuit, wherein the variable resistor circuit includes a resistive material and a first plurality of tap inputs configured to set a resistance of the variable resistor circuit;
an output configured to provide a current, wherein the current is adjustable by varying the resistance of the variable resistor circuit;
a replica variable resistor circuit, wherein:
the replica variable resistor circuit includes a resistive material of a same resistive material type as the resistive material of the variable resistor circuit,
the replica variable resistor circuit includes a second plurality of tap inputs configured to set a resistance of the replica variable resistor circuit, wherein each tap resistance of the replica variable resistor circuit is a same tap resistance as a corresponding tap resistance of the variable resistor circuit, and
the replica variable resistor circuit is coupled to a test port such that, during a test mode, a tester is capable of determining a desired resistance of the replica variable resistor circuit, wherein a set of select signal values for the second plurality of tap inputs corresponds to the desired resistance; and
a non-volatile storage circuit configured to store a tap value generated during the test mode corresponding to the set of select signal values for the second plurality of tap inputs, wherein during a normal operational mode, the first plurality of tap inputs receives a set of select signal values that are based on the tap value stored in the non-volatile storage circuit in order to set the resistance of the variable resistor circuit to a same resistance as the desired resistance.

19. The current source circuit of claim 18, wherein during normal operation, the current source circuit provides current though the variable resistor circuit and current is not provided through the replica variable resistor circuit.

\* \* \* \* \*